(12) United States Patent
Kato

(10) Patent No.: US 11,476,206 B2
(45) Date of Patent: Oct. 18, 2022

(54) SEMICONDUCTOR DEVICE AND METHOD OF MANUFACTURING SAME

(71) Applicant: ABLIC Inc., Tokyo (JP)

(72) Inventor: Takahiro Kato, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/174,847

(22) Filed: Feb. 12, 2021

(65) Prior Publication Data

US 2021/0265283 A1  Aug. 26, 2021

(30) Foreign Application Priority Data

Feb. 21, 2020 (JP) .............................. JP2020-027648

(51) Int. Cl.
| | |
|---|---|
| H01L 23/495 | (2006.01) |
| H01L 23/00 | (2006.01) |
| H01L 21/56 | (2006.01) |
| H01L 23/31 | (2006.01) |

(52) U.S. Cl.
CPC ............ *H01L 23/562* (2013.01); *H01L 21/56* (2013.01); *H01L 23/3107* (2013.01); *H01L 23/49541* (2013.01)

(58) Field of Classification Search
CPC . H01L 23/3107; H01L 23/3135; H01L 23/28; H01L 23/562; H01L 23/3114
USPC ......................................... 257/676, 666, 790
See application file for complete search history.

(56) References Cited

U.S. PATENT DOCUMENTS

| | | | | |
|---|---|---|---|---|
| 4,803,543 A | * | 2/1989 | Inayoshi ............... | H01L 23/295 257/793 |
| 4,951,122 A | * | 8/1990 | Tsubosaki ........... | H01L 23/4951 257/796 |
| 5,287,003 A | * | 2/1994 | Van Andel .......... | H01L 23/3135 257/E23.126 |
| 5,883,439 A | * | 3/1999 | Saitoh ..................... | H01L 24/32 257/793 |
| 7,821,007 B2 | * | 10/2010 | Choi .................. | H01L 29/78621 257/408 |
| 7,960,818 B1 | * | 6/2011 | Davis ................ | H01L 23/49503 257/676 |
| 2002/0088632 A1 | * | 7/2002 | Salatino ................ | H01L 21/565 174/522 |
| 2013/0099366 A1 | * | 4/2013 | Cruz ..................... | H01L 23/495 257/676 |
| 2021/0215549 A1 | * | 7/2021 | Suzuki ..................... | G01K 1/12 |

FOREIGN PATENT DOCUMENTS

JP  2014-027266 A  2/2014

* cited by examiner

*Primary Examiner* — Nitin Parekh
(74) *Attorney, Agent, or Firm* — Crowell & Moring LLP

(57) ABSTRACT

A semiconductor element is mounted on a die pad, and electrode pads arranged along the outer circumference of an upper surface of the semiconductor element are electrically connected to leads by wires, respectively. The semiconductor element has an element region having a high sensitivity with respect to stress, and an element region having a relatively low sensitivity with respect to stress. A low-stress resin film is provided on the element region having a high sensitivity with respect to stress. The semiconductor element, the low-stress resin film, the die pad, and the leads are covered with an encapsulating resin.

11 Claims, 10 Drawing Sheets

SEMICONDUCTOR DEVICE AND METHOD OF MANUFACTURING SAME

RELATED APPLICATIONS

This application claims priority to Japanese Patent Application No. 2020-027648, filed Feb. 21, 2020, the entire content of which is incorporated herein by reference.

BACKGROUND OF THE INVENTION

1. Field of the Invention

The present invention relates to a semiconductor device and a method of manufacturing the same.

2. Description of the Related Art

Along with the needs for downsizing and reducing the weight of electronic devices and improving the functions thereof, surface mount packages have been frequently used. A surface mount package allows high-density mounting of semiconductor devices on an electronic device. In analog ICs or the like, in recent years, further increase in accuracy of electrical characteristics has been demanded. However, during a packaging step or other mounting steps, stress may be applied to a semiconductor element to cause variations in electrical characteristics. Accordingly, target electrical characteristics may not be obtained.

A low-stress resin film having a Young's modulus smaller than that of a mold resin may be provided between the mold resin and the semiconductor element. In this manner, stress to be applied to the semiconductor element can be reduced (see, for example, Japanese Patent Application Laid-open No. 2014-27266).

However, in such an environment that requirements for variations in electrical characteristics are becoming more severe, further reduction of the stress to be applied to the semiconductor element is demanded.

SUMMARY OF THE INVENTION

The present invention has an object to provide a semiconductor device capable of reducing stress to be applied to a semiconductor element.

In order to solve the above-mentioned problem, the present invention adopts the following measures.

There is provided a semiconductor device including: a semiconductor element; a die pad on which the semiconductor element is placed; a lead arranged so as to be spaced apart from the die pad; a low-stress resin film provided on an element surface of the semiconductor element; and an encapsulating resin for covering the semiconductor element, the low-stress resin film, the die pad, and the lead, wherein the low-stress resin film has a Young's modulus which is smaller than a Young's modulus of the encapsulating resin, and has a first concave curved surface in a surface of the low-stress resin film opposite to a surface thereof in contact with the semiconductor element.

Further, there is provided a method of manufacturing a semiconductor device including: a semiconductor element; a die pad on which the semiconductor element is placed; a lead arranged so as to be spaced apart from the die pad; a low-stress resin film provided on an element surface of the semiconductor element; and. an encapsulating resin for covering the semiconductor element, the low-stress resin film, the die pad, and the lead, the method including: preparing the die pad and the lead arranged so as to be spaced apart from the die pad; mounting the semiconductor element on the die pad; forming, on the element surface of the semiconductor element, the low-stress resin film in which a first back surface is a planar surface and a first main surface opposite to the first back surface is a first concave curved surface; and forming the encapsulating resin to cover the semiconductor element, the low-stress resin film, the die pad, and the lead.

Through use of the above-mentioned measures, the semiconductor device capable of reducing the stress to be applied to the semiconductor element from the encapsulating resin can be achieved.

DETAILED DESCRIPTION OF THE PREFERRED EMBODIMENTS

Now, a semiconductor device according to each embodiment of the present invention is described in detail.

Figure 1A:
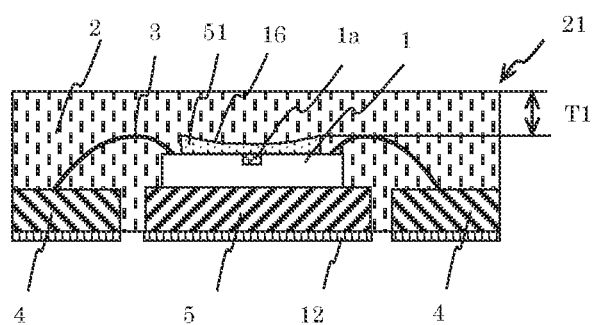
FIG. 1A and FIG. 1B show a semiconductor device according to a first embodiment of the present invention.
Figure 1B:
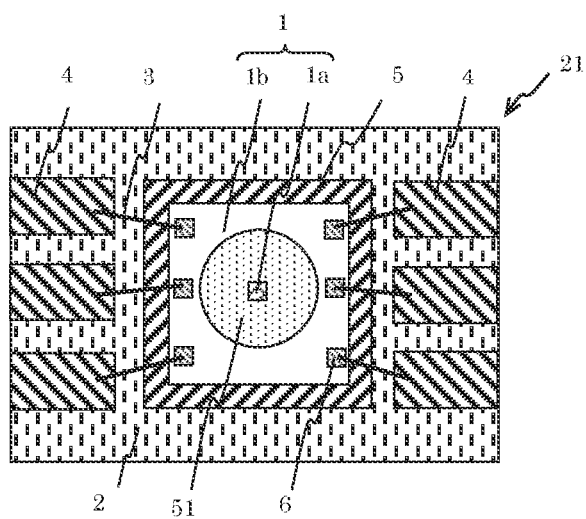

FIG. 1A and FIG. 1B show a semiconductor device according to a first embodiment of the present invention. As illustrated in the sectional view of FIG. 1A, a semiconductor element 1 is mounted on a die pad 5. Leads 4 are provided around the die pad 5 so as to be spaced apart from the die pad 5. Further, electrode pads (not shown) provided on an upper surface of the semiconductor element 1 are electrically connected to upper surfaces of the leads 4 by wires 3 serving as connecting members, respectively. As the material for the wires 3, gold (Au) or copper (Cu) is used. The electrical connection between the semiconductor element 1 and the leads 4 is not limited to the wire method, and there may be employed a flip-chip bonding method using bumps.

Peripheries of the semiconductor element 1, the die pad 5, and the wires 3 are covered with an encapsulating resin 2, but a back surface of the die pad 5 on an opposite side of the surface on which the semiconductor element 1 is mounted is exposed from the encapsulating resin 2. The back surface of the die pad 5 is covered with a plating layer 12 to have a shape excellent in heat radiation performance. Bottom surfaces and outer side surfaces of the leads 4 are also exposed from the encapsulating resin 2, and the exposed bottom surfaces of the leads 4 are also covered with the plating layer 12. The outer side surfaces of the leads 4 are not protruded from side surfaces of the encapsulating resin, thereby forming a non-leaded type semiconductor device 21. The plating layer 12 is made of any one of metals of lead (Pb), bismuth (Bi), tin (Sn), copper (Cu), silver (Ag), palladium (Pd), and gold (Au), or an alloy of a plurality of the metals, and is formed by an electrolytic plating method or a non-electrolytic plating method.

The semiconductor element 1 included in the semiconductor device 21 has, in an element surface thereof, an element region 1a having a high sensitivity with respect to stress, and a low-stress resin film 51 is provided so as to cover the element region 1a. A back surface of the low-stress resin film 51 is provided in contact with the element surface of the semiconductor element 1, and a main surface of the low-stress resin film 51 which is a surface opposite to the back surface in its thickness direction is a concave spherical surface 16. Further, the die pad 5, the semiconductor element 1, the low-stress resin film 51, and the leads 4 are encapsulated by the encapsulating resin 2. An upper surface of the encapsulating resin 2 is parallel to the element surface of the semiconductor element 1. With such a shape, stress from the encapsulating resin 2 is dispersed by the concave spherical surface 16, and stress to be applied to the element region 1a having a high sensitivity with respect to stress is reduced. in this case, the Young's modulus of the low-stress resin film 51 is smaller than the Young's modulus of the encapsulating resin 2. In FIG. 1A, a relatively shallow concave spherical surface is illustrated, but the radius of the curvature of the spherical surface can be decreased to achieve a deep concave spherical surface. Further, similar effects can be obtained even in a case in which the concave spherical surface 16 is a concave curved surface having a plurality of curvatures.

As illustrated, the height of the highest part of the main surface of the low-stress resin film 51 is desired to be equivalent to or smaller than a loop height of the wires 3. In this example, the concave spherical surface is formed in the main surface of the low-stress resin film 51. Accordingly, the outermost end portion is the highest part, and this part is formed to be equivalent to the loop height. With such a shape, a thickness T1 from the upper surface of the encapsulating resin 2 to a main-surface end portion of the low-stress resin film 51 is set to be equivalent to the thickness of the encapsulating resin 2 above the wires 3. In this manner, reduction in reliability due to the provision of the low-stress resin film 51 is avoided.

FIG. 1B is a transparent plan view as viewed from the top of the semiconductor device. The die pad 5 is arranged in a center region of the rectangular encapsulating resin 2. A plurality of leads 4 are arranged along one side (side surface) of the encapsulating resin 2, and a plurality of leads 4 are arranged along another side (side surface) opposed to the one side. Further, the leads 4 arranged along the respective sides (side surfaces) face each other across the die pad 5. The semiconductor element 1 is mounted on the die pad 5, and electrode pads 6 arranged along the outer circumference of the semiconductor element 1 are electrically connected to the leads 4 by the wires 3, respectively. The semiconductor element 1 has the element region 1a having a high sensitivity with respect to stress, and an element region 1b having a relatively low sensitivity with respect to stress.

By resin shrinkage during resin hardening and during return to normal temperature of the high-temperature molten resin injected into a mold, stress such as compression or shear may be applied to the semiconductor element 1 made of silicon, generating a piezoelectric effect in the single crystal silicon, to thereby cause variations in electrical characteristics of semiconductor integrated circuit elements formed on the surface of the semiconductor element. Among the semiconductor integrated circuit elements, an element whose electrical characteristics are liable to vary by the piezoelectric effect corresponds to an element formed in the element region having a high sensitivity with respect to stress. For example, a current mirror circuit uses the fact that the currents having the same magnitude flow through the P-channel MOS transistors forming a pair, to thereby take an action in which currents of two current paths are made equal. However, application of stress to this circuit causes deviation of the currents of the two current paths. The transistors forming such a pair should have characteristics that are little different from each other, and are desired to be formed in the above-mentioned element region 1a having a high sensitivity with respect to stress.

The low-stress resin film 51 is formed so as to cover the element region 1a having a high sensitivity with respect to stress, and a peripheral portion of the low-stress resin film 51 has a circular shape. The electrode pads 6 are arranged in the outer circumference region of the semiconductor element 1, but the low-stress resin film 51 is desired not to overlap the regions in which the electrode pads 6 are arranged. With such a shape, the resin covering the wires 3 is only the encapsulating resin 2, and accordingly disconnection of the wires 3 can he avoided.

As described above, the low-stress resin film 51 is provided on the element region 1a having a high sensitivity with respect to stress. In this manner, the stress from the encapsulating resin 2 is dispersed by the concave spherical surface 16, and the stress to be applied to the element region 1a having a high sensitivity with respect to stress is reduced. As a result, it is possible to reduce deviation of an electrical characteristic value obtained from a circuit formed in the element region 1a from an original value. As described above, with the above-mentioned structure, the semiconductor device 21 capable of reducing the stress to be applied to the semiconductor element 1 from the encapsulating resin can be achieved.

Description has been given above of an example of a dual flat non-leaded (DFN) package in which the leads 4 are provided to the respective two side surfaces of the encapsulating resin 2, but the present technology is also applicable to a quad flat non-leaded (QFN) package in which the leads 4 are provided to respective four side surfaces of the encapsulating resin 2. Further, the present technology is not limited to the semiconductor device in which the die pad is exposed from the encapsulating resin, and is also applicable to a full-molded type semiconductor device.

Figure 2A:
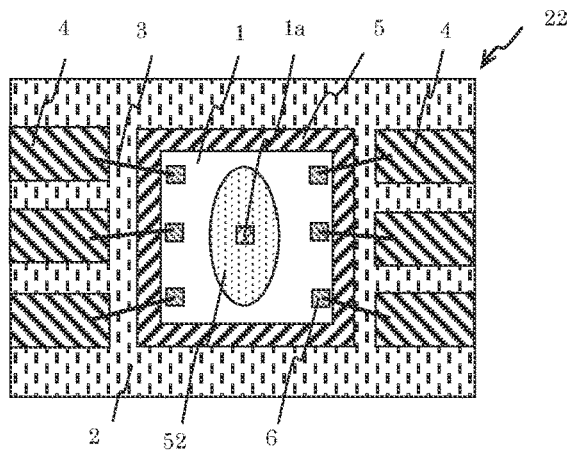
FIG. 2A, FIG. 2B, and FIG. 2C show a semiconductor device according to a second embodiment of the present invention.
Figure 2B:
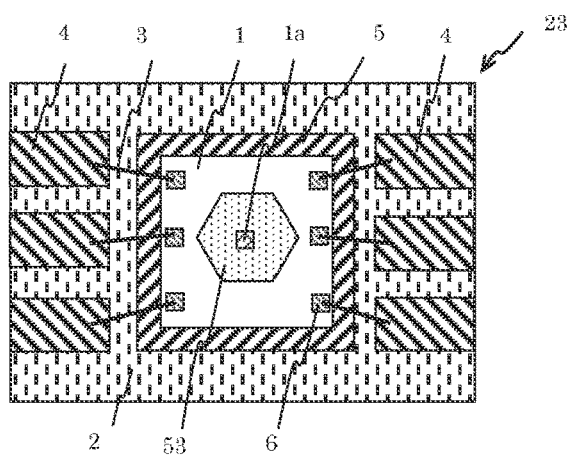
Figure 2C:
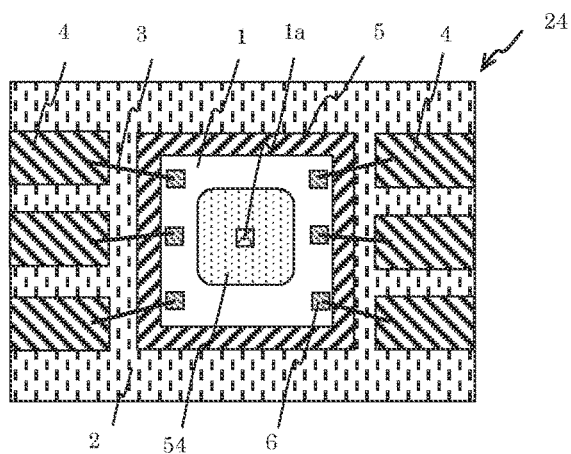

FIG. 2A to FIG. 2C show a semiconductor device according to a second embodiment of the present invention, and show various shapes of the low-stress resin film. A semiconductor device 22 illustrated in FIG. 2A represents an example in which a low-stress resin film 52 has an elliptical peripheral portion, and the element region 1a having a high sensitivity with respect to stress is provided in the vicinity of the center of a region surrounded by the ellipse. A semiconductor device 23 illustrated in FIG. 2B represents an example in which a low-stress resin film 53 has a polygonal peripheral portion in which all interior angles are obtuse angles. The element region 1a having a high sensitivity with respect to stress is provided in the vicinity of the center of the polygonal peripheral portion. A semiconductor device 24 illustrated in FIG. 2C represents an example in which a low-stress resin film 54 has a rectangular peripheral portion with rounded corners. The element region 1a having a high sensitivity with respect to stress is provided in the vicinity of the center of a region surrounded by the rectangle with rounded corners. As described above, in any of the shapes, a part of the peripheral portion of each of the low-stress resin films 52, 53, and 54 does not have a region with an acute angle. With such shapes, there can be achieved a structure in which the encapsulating resin 2 itself provided in contact with the peripheral portion of the low-stress resin is prevented from being cracked.

Figure 3A:
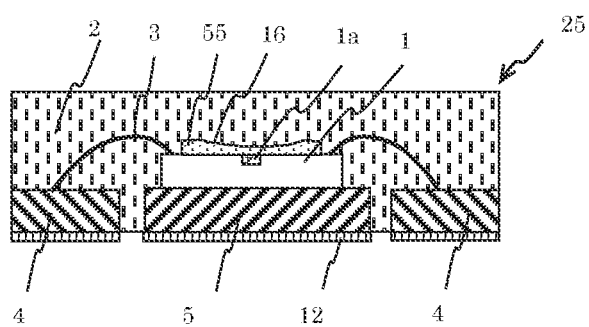
FIG. 3A and FIG. 3B show a semiconductor device according to a third embodiment of the present invention.
Figure 3B:
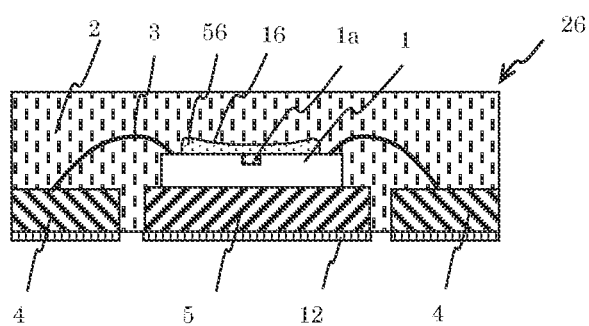

FIG. 3A and FIG. 3B show a semiconductor device according to a third embodiment of the present invention. This semiconductor device is different from the semiconductor device 21 illustrated in FIG. 1A and FIG. 1B in that a part having an acute angle of a main-surface end portion positioned at an outer end of a main surface of a low-stress resin film 55 is removed. In a semiconductor device 25 illustrated in FIG. 3A, the main-surface end portion is shaped as a planar surface, and the concave spherical surface 16 is formed on the inner side of this planar region. Further, in a semiconductor device 26 illustrated in FIG. 3B, a low-stress resin film 56 has a rounded upper end portion. With such shapes, a part protruding at an acute angle with respect to the encapsulating resin 2 is eliminated from each of the low-stress resin films 55 and 56, and the encapsulating resin 2 itself can have a structure which is strong against cracks. Even in a case in which the shape of the main-surface end portion is changed as described above, each of the low-stress resin films 55 and 56 having the concave spherical surface 16 is provided on the element region 1a having a high sensitivity with respect to stress. In this manner, the stress from the encapsulating resin 2 is dispersed obliquely downward by the concave spherical surface 16, and the stress to be applied to the element region 1a, having a high sensitivity with respect to stress is reduced. As a result, the deviation of the electrical characteristic value obtained from the circuit formed in this element region 1a from the original value can be avoided, as in the case of the semiconductor device 21 according to the first embodiment.

Figure 4:
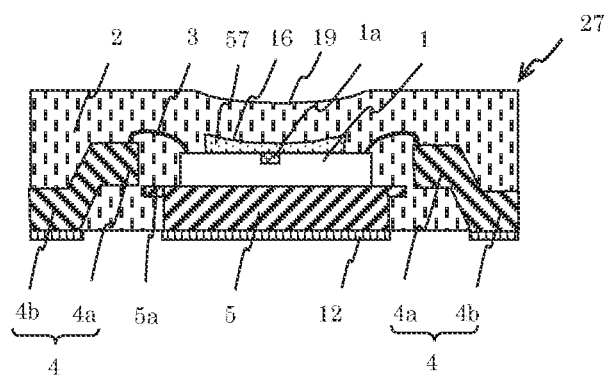
FIG. 4 shows a semiconductor device according to a fourth embodiment of the present invention.

FIG. 4 shows a semiconductor device according to a fourth embodiment of the present invention. This semiconductor device is different from the semiconductor device 21 according to the first embodiment illustrated in FIG. IA and FIG. 1B in a cross-sectional shape of an upper surface of the encapsulating resin 2. Description is given below by means of a semiconductor device of a non-leaded type having the lead structure different from that of the first embodiment.

The semiconductor element 1 is mounted on the die pad 5, and the leads 4 are provided around the die pad 5 so as to he spaced apart from the die pad 5. The electrode pads (not shown) on the semiconductor element 1 are electrically connected to the leads 4 by the wires 3, respectively. Each of the leads 4 includes an inner lead portion 4a and an outer lead portion 4b, and each of the leads 4 is bent so that the inner lead portion 4a becomes higher than the outer lead portion 4b. Further, the semiconductor element 1 on the die pad 5, the wires 3, and the leads 4 are encapsulated by the encapsulating resin 2. The back surface of the die pad 5 on the opposite side of the surface on which the semiconductor element 1 is mounted is exposed from the encapsulating resin 2, and the exposed surface is covered with the plating layer 12 to be excellent in heat radiation performance. The die pad 5 has, at an upper end portion thereof, a thinned portion 5a obtained by reducing the thickness of the die pad 5. The encapsulating resin 2 extends to a back surface of the thinned portion 5a, to thereby achieve the structure in which the die pad 5 is less liable to slip out from the encapsulating resin.

The inner lead portions 4a of the leads 4 are encapsulated by the encapsulating resin 2, but the back surface of the die pad 5 and bottom surfaces of the outer lead portions 4b which are flush with the bottom surface of the encapsulating resin 2 are exposed from the encapsulating resin 2 to be covered with the plating layer 12.

In the first embodiment, the upper surface is parallel to the element surface of the semiconductor element 1, but in the fourth embodiment, a part of the upper surface of the encapsulating resin 2 is formed into a concave spherical surface 19. The concave spherical surface 19 formed in the encapsulating resin 2 is positioned above the concave spherical surface 16 provided in a low-stress resin film 57. In plan view, the concave spherical surface 19 overlaps the concave spherical surface 16 and has a size equivalent to or larger than the concave spherical surface 16. In a case in which the concave spherical surface 19 of the encapsulating resin 2 and the concave spherical surface 16 of the low-stress resin film 57 have the same curvature, the encapsulating resin 2 provided on the low-stress resin film 57 has a uniform thickness, and stress to be applied from the encapsulating resin 2 to the main surface of the low-stress resin film 57 is substantially uniform. Further, this stress is dispersed via the concave spherical surface 16 of the low-stress resin film 57 so that the stress to be applied to the element region 1a having a high sensitivity with respect to stress becomes smaller than that in a case in which the encapsulating resin 2 has a planar upper surface. As a result, it is possible to reduce the deviation of the electrical characteristic value obtained from the circuit formed in this element region 1a from the original value. As described above, with the above-mentioned structure, a semiconductor device 27 capable of reducing the stress to be applied to the semiconductor element 1 from the encapsulating resin 2 can be achieved.

The fourth embodiment is described by means of a non-leaded type semiconductor device in which the leads 4 have the upset structure, but the forming of the concave spherical surface 19 in the encapsulating resin 2 is also applicable to other non-leaded type semiconductor devices as illustrated in FIG. 1A and FIG. 1B.

In FIG. 4, the concave spherical surface 19 of the encapsulating resin 2 and the concave spherical surface 16 of the low-stress resin film 57 have the same curvature, but the present invention is not limited to this example. The concave spherical surfaces may have curvatures different from each other. Further, the concave spherical surface 19 may be a concave curved surface having a plurality of curvatures.

Figure 5A:
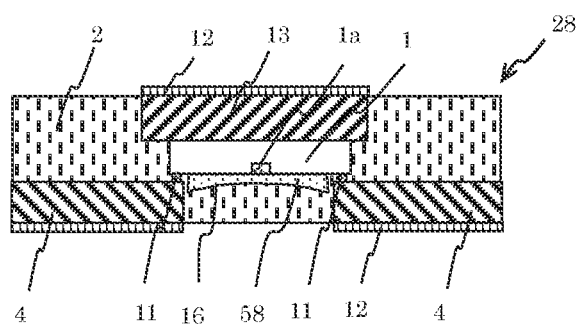
FIG. 5A and FIG. 5B show a semiconductor device according to a fifth embodiment of the present invention.
Figure 5B:
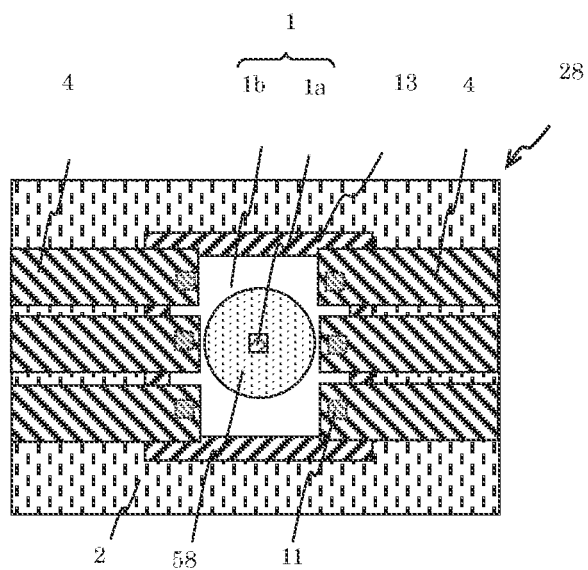

FIG. 5A and FIG. 5B show a semiconductor device according to a fifth embodiment of the present invention. The fifth embodiment is different from the first embodiment in that a flip-chip bonding method is used instead of using the wire bonding method.

In the first embodiment, there is employed the structure in which the element surface of the semiconductor element 1 is directed opposite to the leads 4, but in the fifth embodiment, there is employed the structure in which, as illustrated in a cross-sectional view of FIG. 5A, the element surface of the semiconductor element 1 fixed to a lower surface of a heat radiation plate 13 made of a metal material is directed toward the leads 4. Bump electrodes 11 are provided on the element surface of the semiconductor element 1, and the element surface of the semiconductor element 1 faces and is electrically connected to the leads 4 by the bump electrodes 11. Each of the bump electrodes 11 is made of a metal material such as tin (Sn) or gold (Au).

The heat radiation plate 13 and the leads 4 sandwich the semiconductor element 1 from above and below. In this structure, the semiconductor element 1, the heat radiation plate 13, and the leads 4 are covered with the encapsulating resin 2. However, a back surface of the heat radiation plate 13, that is, a surface corresponding to an upper surface of the heat radiation plate 13 in FIG. 5A is exposed from the encapsulating resin 2 to be covered with the plating layer 12. Further, the bottom surfaces and the outer side surfaces of the leads 4 are also exposed from the encapsulating resin 2, and the exposed surfaces of the bottom surfaces of the leads 4 are also covered with the plating layer 12. Thus, a non-leaded type semiconductor device 28 in which the outer side surfaces of the leads 4 are not protruded from the side surfaces of the encapsulating resin is achieved.

The semiconductor element 1 has, in a part of the element surface thereof, the element region 1a having a high sensitivity with respect to stress, and a low-stress resin film 58 is formed below the element region 1a. The low-stress resin film 58 is selectively formed below the element region 1a having a high sensitivity with respect to stress, and is formed not to overlap the entire region of the semiconductor element 1.

FIG. 5B is a plan view as viewed from the bottom surface side of the semiconductor device 28. The plating layer 12 is not shown. The heat radiation plate 13 made of a copper material is arranged in a center region of the rectangular encapsulating resin 2. A plurality of leads 4 are arranged along one side (side surface) of the encapsulating resin 2, and a plurality of leads 4 are arranged along another side (side surface) opposed to the one side. Further, the leads 4 arranged along the respective sides (side surfaces) face each other with the heat radiation plate 13 serving as the center. The semiconductor element 1 is fixed to the heat radiation plate 13, and the hump electrodes 11 arranged at the outer circumference of the semiconductor element 1 overlap the leads 4 to be electrically connected to the leads 4. The semiconductor element 1 has the element region 1a having a high sensitivity with respect to stress, and the element region 1b having a relatively low sensitivity with respect to stress. For example, a current mirror circuit is a circuit which uses the fact that the same current flows between P-channel MOS transistors forming a pair, to thereby use the action of currents of two current paths being equal to each other. However, application of stress to this circuit causes deviation of the currents of the two current paths. Such transistors forming a pair are required to have characteristics that are not much different from each other, and are desired to be formed in the above-mentioned element region 1a having a high sensitivity with respect to stress.

The low-stress resin film 58 is formed so as to cover the element region 1a having a high sensitivity with respect to stress, and a peripheral portion of the low-stress resin film 58 has a circular shape. Further, the element region 1a having a high sensitivity with respect to stress is provided in the vicinity of the center of the region surrounded by this circle. The bump electrodes 11 are arranged in the outer circumference region of the semiconductor element 1, but the low-stress resin film 58 does not overlap the regions in which the bump electrodes 11 are arranged because the leads 4 and the bump electrodes 11 overlap each other.

As described above, the low-stress resin film 58 having the main surface being the concave spherical surface 16 is provided below the element region 1a having a high sensitivity with respect to stress. In this manner, the stress to be applied to the element region 1a can be reduced. As a result, it is possible to reduce deviation of an electrical characteristic value obtained from a circuit formed in the element region 1a from an original value. As described above, with the above-mentioned structure, the semiconductor device 28 capable of reducing the stress to be applied to the semiconductor element 1 from the encapsulating resin can be achieved.

Description has been given above of an example of a dual flat non-leaded (DFN) package in which the leads 4 are provided to the respective two side surfaces of the encapsulating resin 2, but the present technology is also applicable to a quad flat non-leaded (QFN) package in which the leads 4 are provided to the respective four side surfaces of the encapsulating resin 2. Further, the planar shapes and the cross-sectional shapes illustrated in FIG. 1A to FIG. 3B can be applied to the low-stress resin film.

Figure 6A:
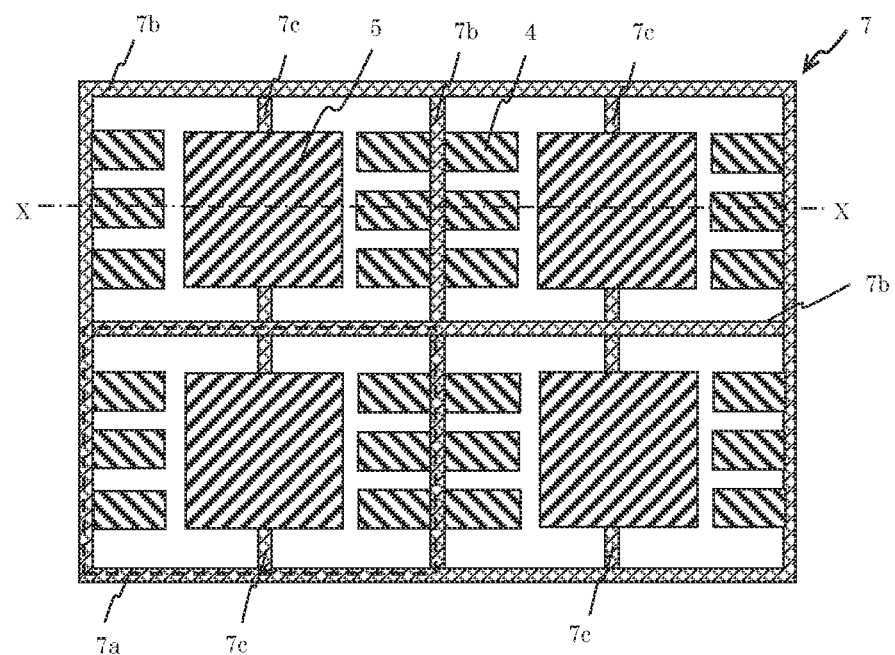
FIG. 6A, FIG. 6B, and FIG. 6C show a method of manufacturing the semiconductor device according to the first embodiment of the present invention.
Figure 6B:
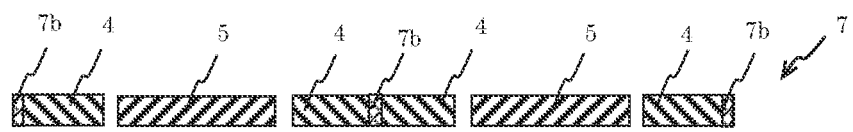
Figure 6C:
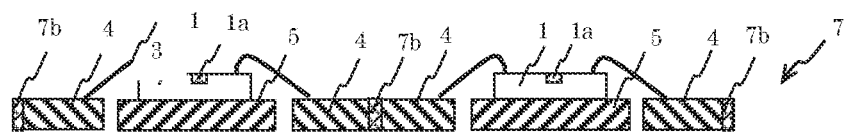

FIG. 6A to FIG. 6C show a method of manufacturing the semiconductor device according to the first embodiment of the present invention. First, as illustrated in FIG. 6A, a lead frame 7 including the die pads 5 and the plurality of leads 4 is prepared. The plurality of leads 4 are arranged around each of the die pads 5 so as to be spaced apart therefrom. The lead frame 7 has a shape including a plurality of units 7a each of which includes the rectangular die pad 5 and the plurality of leads 4 arranged so as to be spaced apart from the die pad 5. As indicated by the broken line, each of the illustrated units 7a is surrounded by frame rims 7b. The leads 4 are connected to the frame rims 7b, and the die pad 5 is connected to the frame rims 7b by suspension leads 7c. The lead frame 7 is mainly made of a copper material. FIG. 6B is a cross-sectional view taken along the line X-X of FIG. 6A. At this stage, the leads 4 of adjacent units 7a are connected to each other by the frame rims 7b.

Next, as illustrated in FIG. 6C, the semiconductor elements 1 are mounted on the die pads 5, and the electrode pads (not shown) provided on each of the semiconductor elements 1 are electrically connected to the leads 4 by the wires 3, respectively.

Figure 7A:
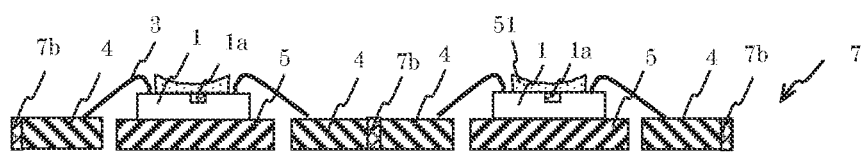
FIG. 7A, FIG. 7B, and FIG. 7C show the method of manufacturing the semiconductor device according to the first embodiment of the present invention.
Figure 7B:
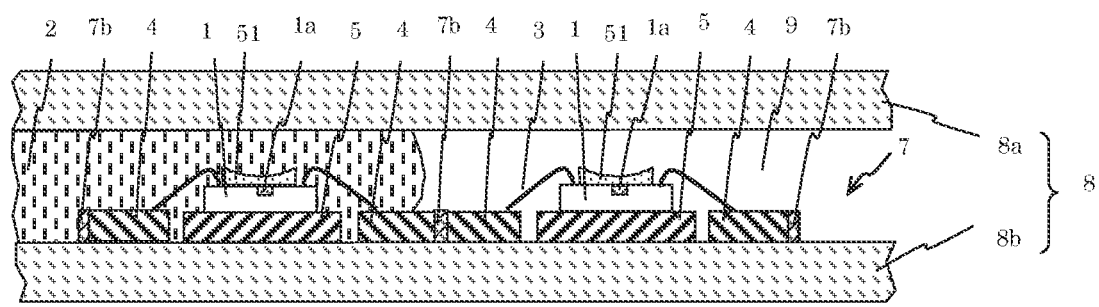
Figure 7C:
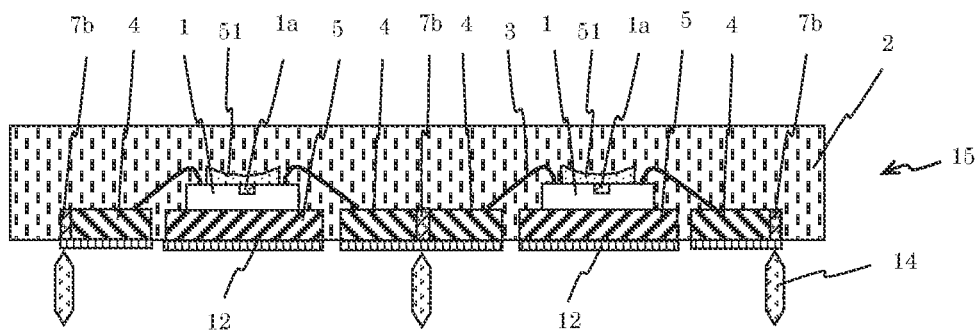

FIG. 7A to FIG. 7C are structure views following FIG. 6A to FIG. 6C, for illustrating the method of manufacturing the semiconductor device according to the first embodiment of the present invention. As illustrated in FIG. 7A, the low-stress resin film 51 is bonded to the element surface of each of the semiconductor elements 1 by thermocompression bonding. The low-stress resin film 51 is a low-stress resin film 51 which is formed into a film shape in advance, and has a hack surface being a planar surface and a main surface being a concave spherical surface. Incidentally, the Young's modulus of the low-stress resin film 51 is 0.1 GPa which is a value extremely lower than the Young's modulus of the encapsulating resin 2 of 20 GPa.

Next, as illustrated in FIG. 7B, a mold 8 for encapsulating the lead frame 7 having the semiconductor elements 1 mounted thereon is prepared. The mold 8 includes an upper mold 8a and a lower mold 8b, and a cavity 9 is formed between the upper mold 8a and the lower mold 8b. Then, the encapsulating resin 2 is caused to flow into the cavity 9 so that the semiconductor elements 1, the die pads 5, the wires 3, and the leads 4 are encapsulated by the encapsulating resin 2.

As illustrated in FIG. 7C, an encapsulated body 15 is taken out from the mold 8, and the plating layer 12 is formed on the back surfaces of the die pads 5 and the bottom surfaces of the leads 4. After that, a rotating blade 14 is used to cut the encapsulated body 15 along the frame rims 7b. At this time, the width of the rotating blade 14 is set to be larger than the width of the frame rim 7b so that the frame rims 7b can be completely removed. The cutting direction by the rotating blade 14 may be any of an upward direction from the bottom surface of the encapsulated body 15 and a downward direction from the upper surface thereof.

Figure 8A:
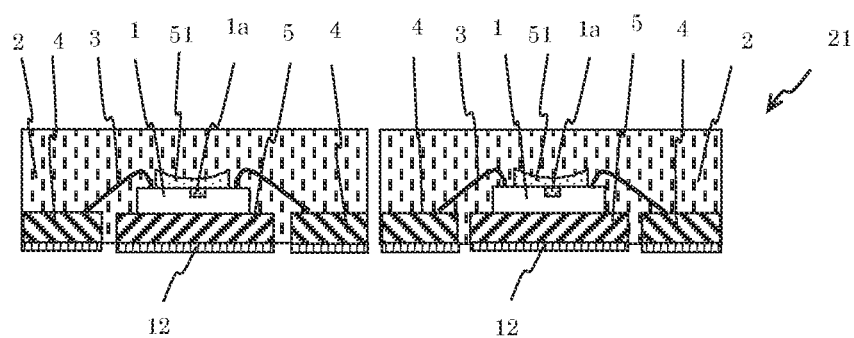
FIG. 8A and FIG. 8B show the method of manufacturing the semiconductor device according to the first embodiment of the present invention.
Figure 8B:
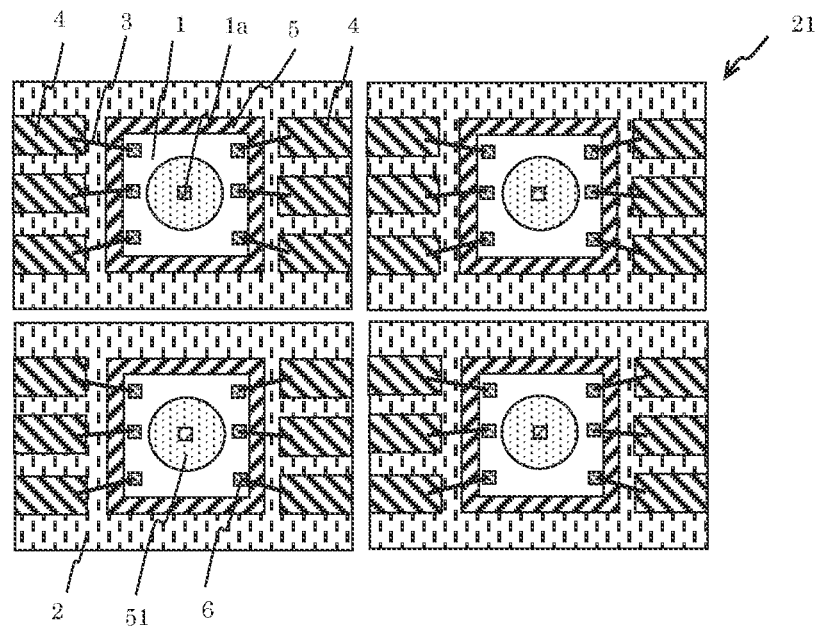

After the cutting, the individually separated semiconductor devices 21 are obtained as illustrated in FIG. 8A and FIG. 8B. FIG. 8A and FIG. 8B are a cross-sectional view and a plan view, respectively, in which a plurality of semiconductor devices 21 are illustrated as an aggregate. Description has been given above of a method of obtaining a plurality of semiconductor devices from one cavity of the mold, but an encapsulating method of obtaining one semiconductor device from one cavity can also be adopted.

Next, effects of the embodiment are described with reference to FIG. 9A to FIG. 9C and FIG. 10.

Figure 9A:
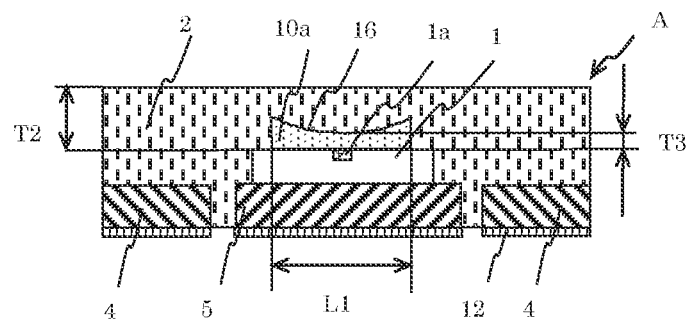
FIG. 9A, FIG. 9B, and FIG. 9C show the semiconductor device according to the first embodiment of the present invention and comparative examples.
Figure 9B:
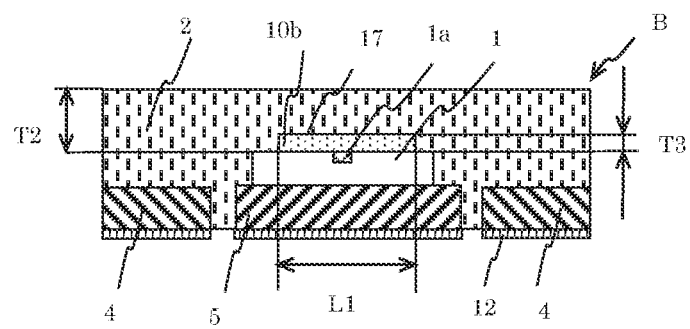
Figure 9C:
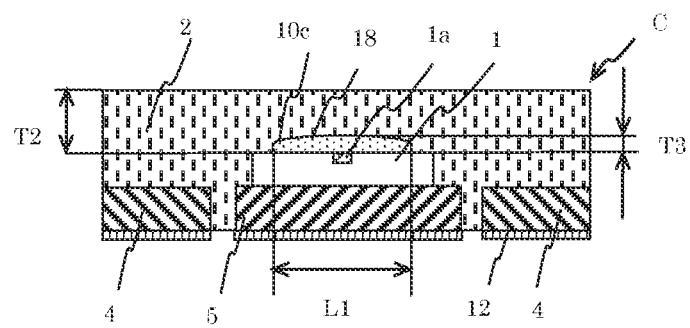

FIG. 9A to FIG. 9C show the semiconductor device according to the first embodiment of the present invention and comparative examples. FIG. 9A shows a semiconductor device A according to the first embodiment of the present invention. FIG. 9B shows a semiconductor device B being a comparative example. FIG. 9C shows a semiconductor device C being a comparative example. In the semiconductor device A, a low-stress resin film 10a, having the main surface being the concave spherical surface 16 is placed on the element surface of the semiconductor element 1, and the electrode pads (not shown) provided on the semiconductor element 1 are electrically connected to the leads 4 by wires (not shown), respectively. Further, the semiconductor element 1, the low-stress resin film 10a, the die pad 5, and the leads 4 are covered with the encapsulating resin 2. In FIG. 9A to FIG. 9C, the wires for electrically connecting the leads 4 to the electrode pads provided on the semiconductor element 1 are not shown. A thickness T2 of the encapsulating resin 2 between the element surface of the semiconductor element 1 and the upper surface of the encapsulating resin 2 is 0.17 mm. A thickness of the low-stress resin film 10a on the element region 1a having a high sensitivity with respect to stress is 0.1 mm. A thickness of the low-stress resin film 10a at the main-surface end portion is 0.135 mm. A width L1 of the low-stress resin film 10a is 0.9 mm. A curvature radius of the concave spherical surface is 2.9 mm. Further, the Young's modulus of the low-stress resin film 51 is 0.1 GPa, and the Young's modulus of the encapsulating resin 2 is 20 GPa.

In the semiconductor device B, a low-stress resin film 10b having the main surface being a planar surface 1 is placed on the element surface of the semiconductor element 1, and the electrode pads (not shown) provided on the semiconductor element 1 are electrically connected to the leads 4 by wires (not shown), respectively. Further, the semiconductor element 1, the low-stress resin film 10b, the die pad 5, and the leads 4 are covered with the encapsulating resin 2. A thickness T2 of the encapsulating resin 2 between the element surface of the semiconductor element 1 and the upper surface of the encapsulating resin 2 is 0.17 mm. A thickness of the low-stress resin film 10b on the element region 1a having a high sensitivity with respect to stress is 0.1 mm. A thickness of the low-stress resin film 10b at the main-surface end portion is 0.135 mm. A width L1 of the low-stress resin film 10b is 0.9 mm. Further, the Young's modulus of the low-stress resin film 51 is 0.1 GPa, and the Young's modulus of the encapsulating resin 2 is 20 GPa.

In the semiconductor device C, a low-stress resin film 10c having the main surface being a convex spherical surface 18 is placed on the element surface of the semiconductor element 1, and the electrode pads (not shown) provided on the semiconductor element 1 are electrically connected to the leads 4 by wires (not shown), respectively. Further, the semiconductor element 1, the low-stress resin film 10c, the die pad 5, and the leads 4 are covered with the encapsulating resin 2. A thickness T2 of the encapsulating resin 2. between the element surface of the semiconductor element 1 and the upper surface of the encapsulating resin 2 is 0.17 mm. A thickness of the low-stress resin film 10c on the element region 1a having a high sensitivity with respect to stress is 0.1 mm. A width L1 of the low-stress resin film 10c is 0.9 mm. A curvature radius of the convex spherical surface 18 is 1.6 mm. Further, the Young's modulus of the low-stress resin film 51 is 0.1 GPa, and the Young's modulus of the encapsulating resin 2 is 20 GPa.

As described above, the semiconductor devices A, B, and C only have a difference in the shape of the main surface of each of the low-stress resin films 10a, 10b, and 10c, and other dimensions are the same.

Figure 10:
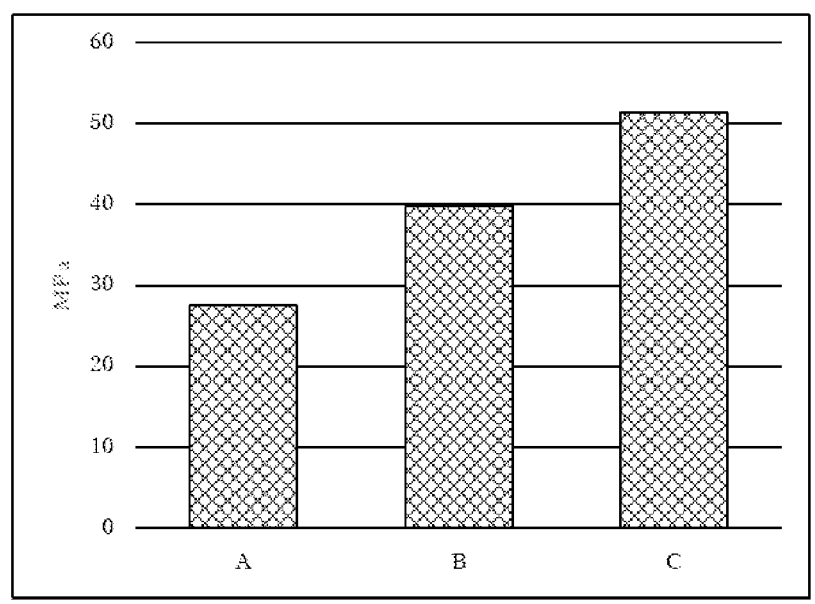
FIG. 10 is a graph for showing effects of the semiconductor device according to the first embodiment of the present invention.

FIG. 10 shows results obtained by examining the stress to be applied to the element region 1a having a high sensitivity with respect to stress in each of the above-mentioned semiconductor devices A, B, and C. In the semiconductor device A, the semiconductor device B, and the semiconductor device C, a stress of 27.5 MPa, a stress of 39.8 MPa, and a stress of 51.4 MPa are applied to the element region 1a having a high sensitivity with respect to stress, respectively. As described above, how much stress is applied to the semiconductor element 1 is apparently different depending on the shape of the main surface of the low-stress resin film. It is understood that smaller stress is applied in the case in which the main surface is the concave spherical surface 16 as compared to the case in which the main surface is the planar surface 17, and larger stress is applied in the case in which the main surface is the convex spherical surface 18 as compared to the case in which the main surface is the planar surface 17.

In a case in Which the low-stress resin film is formed on the semiconductor element 1, a method of dropping a liquid low-stress resin is generally used. Accordingly, the main surface shape of the low-stress resin often becomes the convex spherical surface 18 as in the semiconductor device C. Such a shape causes the stress from the encapsulating resin 2 to concentrate by the convex spherical surface 18 to the semiconductor element 1, in particular, the element region 1a having a high sensitivity with respect to stress arranged in the vicinity of the center of the semiconductor element 1. As a result, stress larger than that in the case in which the main surface is the planar surface 17 is applied. Meanwhile, it is considered that, in the semiconductor device A including the low-stress resin film 10a in which the main surface is the concave spherical surface 16, the stress from the encapsulating resin 2 is dispersed by the concave spherical surface 16, and stress smaller than that in the case in which the main surface is the planar surface 17 is accordingly applied.

As described above, the main surface of the low-stress resin film is formed into the concave spherical surface, thereby being capable of achieving the semiconductor device capable of greatly reducing the stress to be applied to the semiconductor element 1 and having small variations in electrical characteristics even after encapsulation of the semiconductor element.

What is claimed is:
1. A semiconductor device, comprising:
a semiconductor element;
a die pad on which the semiconductor element is placed;
a lead arranged so as to be spaced apart from the die pad;

at least one of wires or bump electrodes extending between the lead and an element surface of the semiconductor element;

a low-stress resin film provided on the element surface of the semiconductor element and not covering the at least one of the wires or bump electrodes; and an encapsulating resin for covering the semiconductor element, the low-stress resin film, the die pad, and the lead, wherein the low-stress resin film has a Young's modulus which is smaller than a Young's modulus of the encapsulating resin, and has a first concave curved surface in a surface of the low-stress resin film opposite to a surface thereof in contact with the semiconductor element.

2. The semiconductor device according to claim 1, wherein, in plan view, the low-stress resin film has a polygonal peripheral portion in which all interior angles are obtuse angles.

3. The semiconductor device according to claim 2, wherein the element surface of the semiconductor element is parallel to an upper surface of the encapsulating resin.

4. The semiconductor device according to claim 2, wherein the encapsulating resin has a second concave curved surface in an upper surface thereof.

5. The semiconductor device according to claim 1, wherein, in plan view, the low-stress resin film has one of a circular peripheral portion and an elliptical peripheral portion.

6. The semiconductor device according to claim 5, wherein the element surface of the semiconductor element is parallel to an upper surface of the encapsulating resin.

7. The semiconductor device according to claim 5, wherein the encapsulating resin has a second concave curved surface in an upper surface thereof.

8. The semiconductor device according to claim 1, wherein the element surface of the semiconductor element is parallel to an upper surface of the encapsulating resin.

9. The semiconductor device according to claim 1, wherein the encapsulating resin has a second concave curved surface in an upper surface thereof.

10. A method of manufacturing a semiconductor device including:

a semiconductor element;

a die pad on which the semiconductor element is placed;

a lead arranged so as to be spaced apart from the die pad;

at least one of wires or bump electrodes extending between the lead and an element surface of the semiconductor element;

a low-stress resin film provided on the element surface of the semiconductor element and not covering the at least one of the wires or bump electrodes; and an encapsulating resin for covering the semiconductor element, the low-stress resin film, the die pad, and the lead, the method comprising:

preparing the die pad and the lead arranged so as to be spaced apart from the die pad;

mounting the semiconductor element on the die pad;

connecting the semiconductor element to the lead using the at least one of the wires or bump electrodes;

forming, on the element surface of the semiconductor element, the low-stress resin film in which a first back surface is a planar surface and a first main surface opposite to the first back surface is a first concave curved surface, wherein the low-stress resin film does not cover an area of the element surface of the semiconductor element where the at least one of the wires or bump electrodes connect to the semiconductor element;

forming the encapsulating resin to cover the semiconductor element, the low-stress resin film, the die pad, and the lead.

11. The method of manufacturing a semiconductor device according to claim 10, wherein the forming, on the element surface of the semiconductor element, the low-stress resin film is performed by a method of bonding a film-shaped low-stress resin film.

* * * * *